(12) United States Patent
Liao et al.

(10) Patent No.: US 12,546,821 B2
(45) Date of Patent: Feb. 10, 2026

(54) ELECTRONIC CIRCUIT AND METHOD OF ERROR CORRECTION

(71) Applicant: TAIWAN SEMICONDUCTOR MANUFACTURING COMPANY LTD., Hsinchu (TW)

(72) Inventors: Chia-Chun Liao, Taipei (TW); Chao Chieh Li, Hsinchu (TW); Yu-Tso Lin, New Taipei (TW); Min-Shueh Yuan, Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 16 days.

(21) Appl. No.: 18/788,187

(22) Filed: Jul. 30, 2024

(65) Prior Publication Data

US 2024/0385242 A1 Nov. 21, 2024

Related U.S. Application Data

(63) Continuation of application No. 17/827,834, filed on May 30, 2022, now Pat. No. 12,153,088.

(51) Int. Cl.
G01R 31/317 (2006.01)
G01R 31/3185 (2006.01)

(52) U.S. Cl.
CPC .......... *G01R 31/31727* (2013.01); *G01R 31/318525* (2013.01)

(58) Field of Classification Search
CPC .......... G01R 31/31727; G01R 31/318525
See application file for complete search history.

(56) References Cited

U.S. PATENT DOCUMENTS

| | | | | |
|---|---|---|---|---|
| 5,703,838 A * | 12/1997 | Gorbics | ............... | H03K 5/159 327/31 |
| 7,746,178 B1 * | 6/2010 | Humphreys | ............ | H03L 7/085 331/25 |
| 8,432,304 B2 * | 4/2013 | Dutton | ................. | G04F 10/005 341/94 |
| 8,558,728 B1 * | 10/2013 | Lemkin | .................... | H03L 7/08 341/166 |
| 8,570,082 B1 * | 10/2013 | Kuo | .......................... | H03L 1/00 327/158 |
| 8,604,840 B2 * | 12/2013 | Ahmadi | ................ | H03L 7/1976 327/107 |
| 10,057,051 B2 * | 8/2018 | Huang | .................... | H04L 7/002 |
| 10,108,148 B1 * | 10/2018 | Testi | .................... | G04F 10/005 |
| 10,171,089 B2 * | 1/2019 | Kuo | .......................... | H03L 1/00 |
| 10,503,122 B2 * | 12/2019 | Testi | .................... | G04F 10/005 |
| 10,615,953 B2 * | 4/2020 | Perlmutter | ............. | H03L 7/093 |
| 10,680,622 B2 * | 6/2020 | Monk | .................... | H03L 7/085 |

(Continued)

*Primary Examiner* — Menatoallah Youssef
*Assistant Examiner* — Khareem E Almo
(74) *Attorney, Agent, or Firm* — WPAT LAW; Anthony King

(57) ABSTRACT

An electronic circuit and a method of error correction are provided. The electronic circuit includes a time-to-digital converter (TDC) and an error cancelation circuit. The TDC is configured to generate a first signal. The error cancelation circuit is configured to evaluate a majority of bit values of at least a portion of the first signal to generate a second signal. The number of transitions within the second signal is less than the number of transitions within the first signal.

20 Claims, 10 Drawing Sheets

(56) References Cited

U.S. PATENT DOCUMENTS

| | | | |
|---|---|---|---|
| 10,819,353 B1* | 10/2020 | Monk | H03L 7/23 |
| 11,218,153 B1* | 1/2022 | Moehlmann | H03L 7/0992 |
| 2002/0131538 A1* | 9/2002 | Staszewski | H03L 7/18 |
| | | | 375/355 |
| 2010/0182060 A1* | 7/2010 | Fujino | H03L 7/085 |
| | | | 327/159 |
| 2011/0022890 A1* | 1/2011 | Jeong | H04L 7/033 |
| | | | 714/15 |
| 2019/0393881 A1* | 12/2019 | Monk | H03L 7/146 |
| 2020/0186162 A1* | 6/2020 | Bal | H03M 3/50 |
| 2023/0384373 A1* | 11/2023 | Liao | H03L 7/085 |

* cited by examiner

ELECTRONIC CIRCUIT AND METHOD OF ERROR CORRECTION

PRIORITY CLAIM AND CROSS-REFERENCE

This application is a continuation of U.S. application Ser. No. 17/827,834, filed on May 30, 2022. The above-referenced application is hereby incorporated herein by reference in their entirety.

BACKGROUND

The present disclosure relates, in general, to an electronic circuit and methods for operating the same. Specifically, the present disclosure relates to an electronic circuit and methods of error correction.

Time-to-digital converter (TDC) has been widely used to convert time information to digital signals. However, when small TDC resolution is required for phase locked loops circuits, abnormal transitions between different bit values, known as bubbles, may occur due to the TDC. Therefore, error correction will be needed to address the issue.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures can be arbitrarily increased or reduced for clarity of discussion.

DETAILED DESCRIPTION

Figure 1:
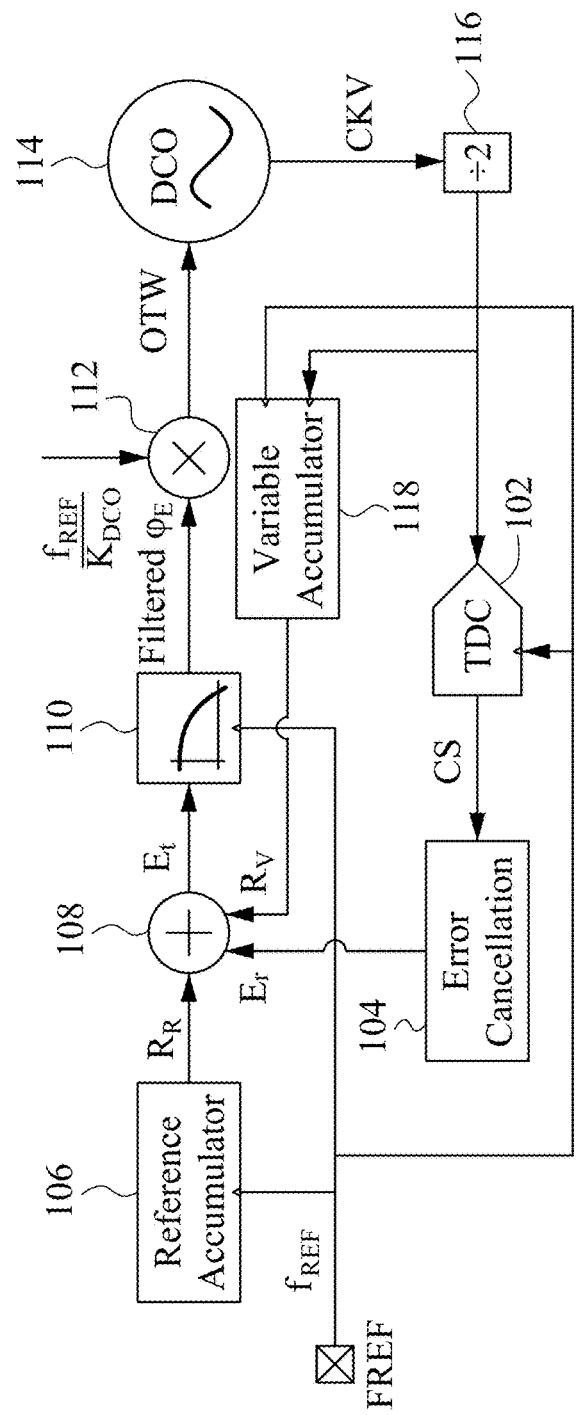
FIG. 1 illustrates a schematic view of an electronic circuit, in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features can be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein may likewise be interpreted accordingly.

As used herein, although terms such as "first," "second" and "third" describe various elements, components, regions, layers and/or sections, these elements, components, regions, layers and/or sections should not be limited by these terms. These terms may only be used to distinguish one element, component, region, layer or section from another. Terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1 illustrates a schematic view of an electronic circuit 10, in accordance with some embodiments of the present disclosure. The electronic circuit 10 includes a time-to-digital converter (TDC) 102, an error cancellation circuit 104, a reference accumulator 106, an adder 108, a digital filter 110, a multiplier 112, a ring based digital controlled oscillator (DCO) 114, a frequency divider 116 and a variable accumulator 118.

Each of the variable accumulator 118, the reference accumulator 106, and the TDC 102 receives the loop reference frequency $f_{REF}$. The TDC 102 is configured to generate a converting signal CS in response to the loop reference frequency $f_{REF}$. The error cancellation circuit 104 is configured to evaluate a majority of bit values of at least a portion of the converting signal CS to generate a phase error signal Er. The number of transitions within the phase error signal Er is less than the number of transitions within the converting signal CS.

In this case, the phase error signal Er from the error cancellation circuit 104, the accumulated variable error $R_V$ from the variable accumulator 118, and the accumulated reference error $R_R$ from the reference accumulator 106 are all added in the adder 108. The total phase error Et from the adder 108 is coupled to the input of the digital filter 110, and the filtered phase error Et from the output of the digital filter 110 is coupled to the multiplier 112.

After the filtered phase error Et is multiplied by a normalization factor in the multiplier 112, an oscillator tuning word OTW is generated and coupled to the input of the DCO 114. Afterwards, the clock signal CKV is generated by the DCO 114 in response to OTW. In this case, the normalization factor multiplied by the multiplier 112 is $f_{REF}/(4*K_{DCO})$, where $K_{DCO}$ is a proportional constant for characterizing the specific DCO 114 and the number is the ratio between the reference oscillation signal $f_{REF}$ and the loop reference frequency $f_{REF}$.

Figure 2:
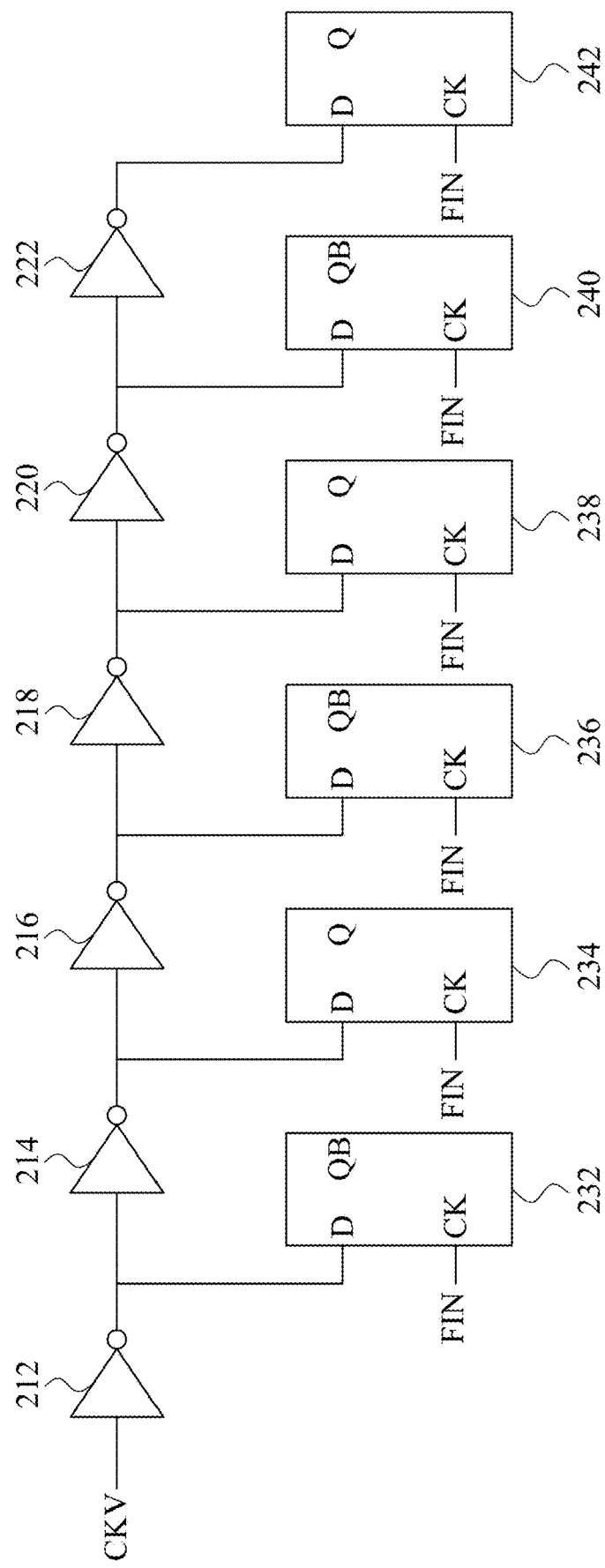
FIG. 2 illustrates a schematic view of a time-to-digital converter, in accordance with some embodiments of the present disclosure.

FIG. 2 illustrates a schematic view of a TDC 202, in accordance with some embodiments of the present disclosure. The TDC 202 could be a circuit block that converts time information to digital signals. The TDC 202 may have two major input clock signals, a DCO clock signal and a reference clock signal. A DCO clock signal with high speed of several GHz may pass multi-stages of delay cells.

In some embodiments, the TDC 202 includes a set of inverters 212 to 222 and a set of flip-flops 232 to 242. In the embodiment of FIG. 2, the inverters 212 to 222 are connected in series. The output of the inverter 212 (the first inverter of the set of inverters 212 to 222) is connected to the input of the inverter 214, and the output of the inverter 214 is connected to the input of the inverter 216.

In addition, each of the flip-flops 232 to 242 is connected with the corresponding inverter. For example, the flip-flop 232 is coupled to the output of the inverter 212, the flip-flop 234 is coupled to the output of the inverter 214, the flip-flop 236 is coupled to the output of the inverter 216, and the flip-flop 242 is coupled to the output of the inverter 222.

In some embodiments, the clock signal CKV is received by the inverter 212. The clock signal FIN is received by the CK node of each of the flip-flops 232 to 242. The clock signal FIN may be different from the clock signal CKV. The clock signal FIN may be the same as the clock signal CKV. The clock signal CKV may have high speed, and the clock signal FIN may have low speed.

In order for the TDC 202 to generate the converting signal CS without bubbles, which represents abnormal transitions between high bit value and low bit value, the TDC resolution could be greater than the sum of the setup margin of the flip-flops 232 to 242, the hold margin of the flip-flops 232 to 242, and the skew of the clock signal FIN. However, sufficient time for the setup margin and the hold margin of the flip-flops 232 to 242 is needed, and thus the bubbles may occur when the TDC resolution is small.

Figure 3:
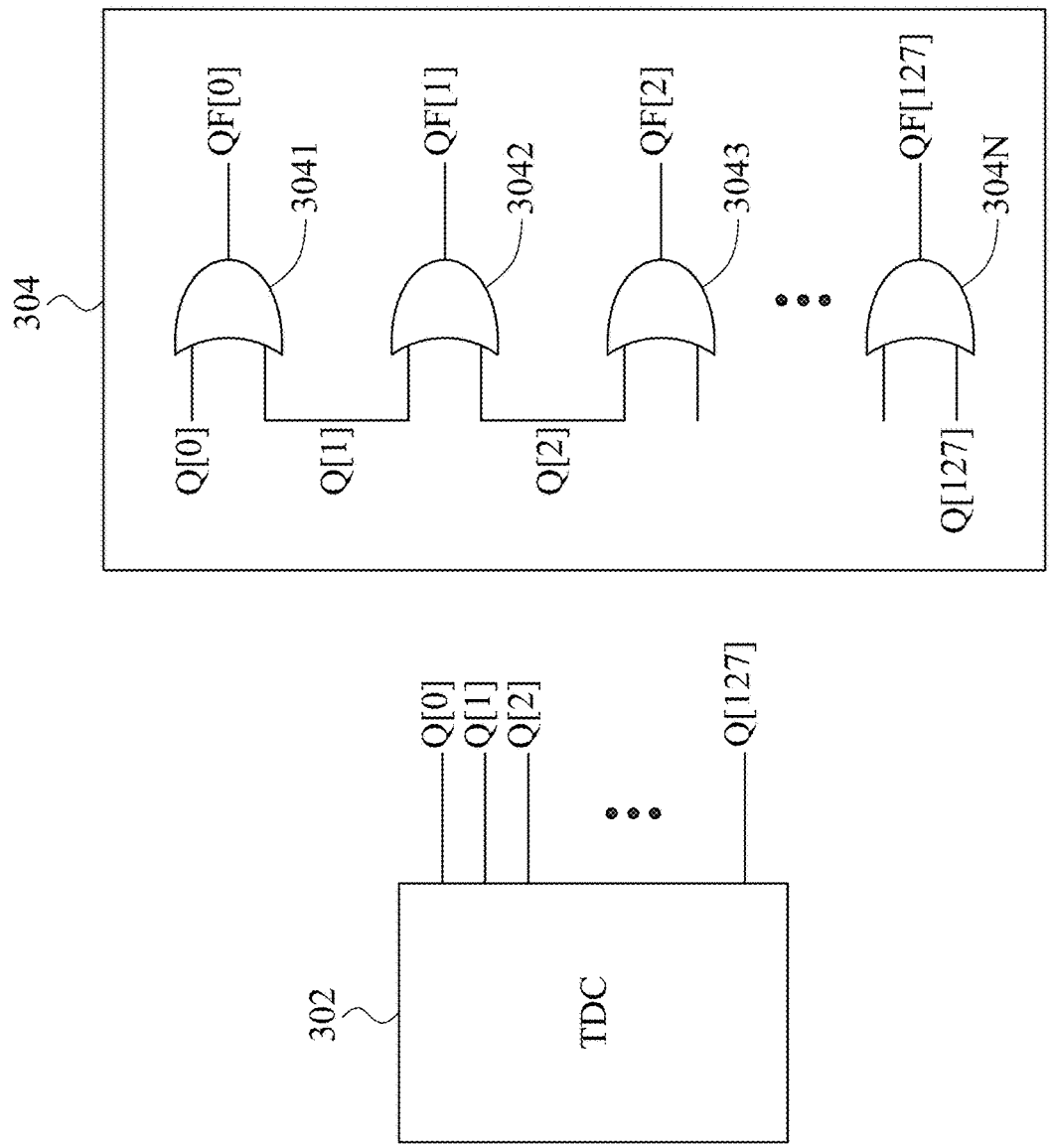
FIG. 3 illustrates a schematic view of a time-to-digital converter and an error cancelation circuit, in accordance with some embodiments of the present disclosure.

FIG. 3 illustrates another schematic view of a TDC 302 and an error cancelation circuit 304, in accordance with some embodiments of the present disclosure. The error cancelation circuit 304 may include a plurality of OR gates 3041 to 304N. Each of the OR gates 3041 to 304N could be utilized to adjust the bit values of the converting signal CS of the TDC 302.

The outputs Q[0]~Q[127] of the TDC 302 could be transmitted to the error cancelation circuit 304. More specifically, the OR gate 3041 includes 2 inputs Q[0], Q[1] and an output QF[0], and the output QF[0] is determined by performing OR logic operation on the inputs Q[0] and Q[1]. Moreover, the OR gate 3042 includes 2 inputs Q[1], Q[2] and an output QF[1], and the output QF[1] is determined by performing OR logic operation on the inputs Q[1] and Q[2].

TABLE 1

| Stage N | Q[N] | QF[N] |
| --- | --- | --- |
| 0 | 0 | 0 |
| 1 | 0 | 0 |
| 2 | 0 | 0 |
| 3 | 0 | 0 |
| 4 | 1 | 1 |
| 5 | 0 | 1 |
| 6 | 1 | 1 |
| 7 | 1 | 1 |
| 8 | 1 | 1 |
| 9 | 1 | 1 |
| 10 | 1 | 1 |
| 11 | 1 | 1 |
| 12 | 0 | 1 |
| 13 | 0 | 0 |
| 14 | 0 | 0 |
| 15 | 0 | 0 |
| 16 | 0 | 0 |

In this case, the bit value of QF[5] is 1 since the bit values of Q[4] and Q[5] are 1 and 0. The bit value of QF[12] is 1 since the bit values of Q[11] and Q[12] are 1 and 0. As a result, regarding the bit values of Q[0]~Q[16] and QF[0]~QF[16], the number of transitions between different bit values of QF[0]~Q[16] is less than the number of transitions between different bit values of Q[0]~QF[16]. Consequently, the bubbles could be reduced by applying the error cancelation circuit 304 of the present disclosure. However, the number of the bit value "1" in QF[0]~QF[16] is greater than the number of the bit value "1" in Q[0]~Q[16].

Figure 4:
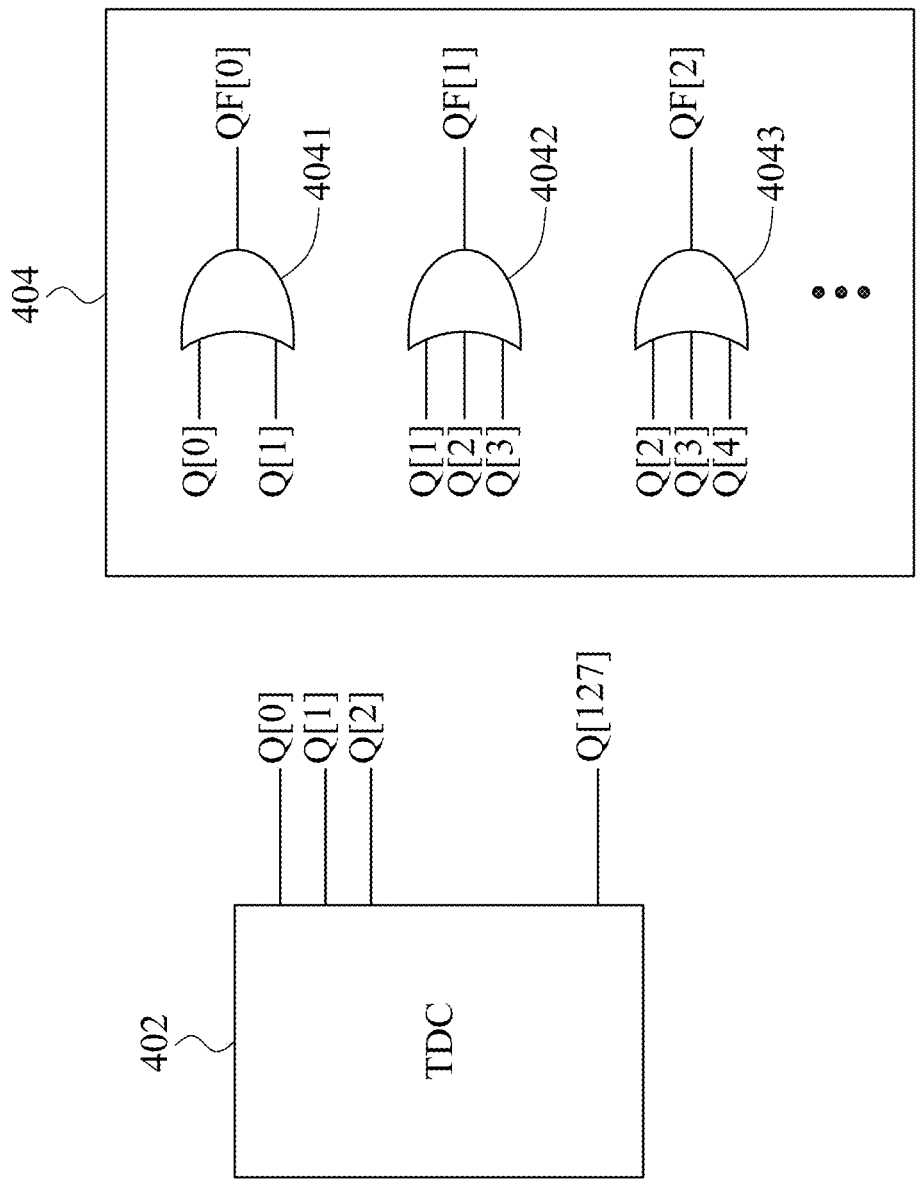
FIG. 4 illustrates another schematic view of a time-to-digital converter and an error cancelation circuit, in accordance with some embodiments of the present disclosure.

FIG. 4 illustrates another schematic view of a TDC 402 and an error cancelation circuit 404, in accordance with some embodiments of the present disclosure. The error cancelation circuit 404 may include a plurality of OR gates, for example, 4041 to 4043. Each of the OR gates 4041 to 4043 could be utilized to adjust the bit values of the converting signal CS of the TDC 402. Each of the OR gates may have the same number of inputs. Each of the OR gates may have a different number of inputs.

The outputs Q[0]~Q[127] of the TDC 402 could be transmitted to the error cancelation circuit 404. More specifically, the OR gate 4041 includes 2 inputs Q[0], Q[1], and an output QF[0]. The output QF[0] is determined by performing OR logic operation on the inputs Q[0] and Q[1]. Moreover, the OR gate 4042 includes 3 inputs Q[1], Q[2], Q[3] and an output QF[1]. The output QF[1] is determined by performing OR logic operation on the inputs Q[1] to Q[3]. The OR gate 4043 includes 3 inputs Q[2], Q[3], Q[4] and an output QF[2]. The output QF[2] is determined by performing OR logic operation on the inputs Q[2] to Q[4]. Therefore, the OR gates 4041 to 4043 have a different number of inputs.

TABLE 2

| Stage N | Q[N] | QF[N] |
|---------|------|-------|
| 0 | 0 | 0 |
| 1 | 0 | 0 |
| 2 | 0 | 0 |
| 3 | 0 | 0 |
| 4 | 1 | 1 |
| 5 | 1 | 1 |
| 6 | 1 | 1 |
| 7 | 1 | 1 |
| 8 | 0 | 1 |
| 9 | 0 | 1 |
| 10 | 1 | 1 |
| 11 | 1 | 1 |
| 12 | 0 | 1 |
| 13 | 0 | 1 |
| 14 | 0 | 0 |
| 15 | 0 | 0 |
| 16 | 0 | 0 |

In this case, the bit value of QF[8] is 1 since the bit values of Q[6] to Q[8] are 1, 1, and 0. The bit value of QF[9] is 1 since the bit values of Q[7] to Q[9] are 1, 0, and 0. In addition, the bit value of QF[12] is 1 since the bit values of Q[10] to Q[12] are 1, 1, and 0. The bit value of QF[13] is 1 since the bit values of Q[11] to Q[13] are 1, 0, and 0.

As a result, regarding the bit values of Q[0]~Q[16] and QF[0]~QF[16], the number of transitions between different bit values of QF[0]~QF[16] is less than the number of transitions between different bit values of Q[0]~Q[16]. The bubbles could be reduced by applying the error cancelation circuit 404 of the present disclosure. However, the number of the bit value "1" for QF[0]~QF[16] is greater than the number of the bit value "1" for Q[0]~Q[16].

Figure 5:
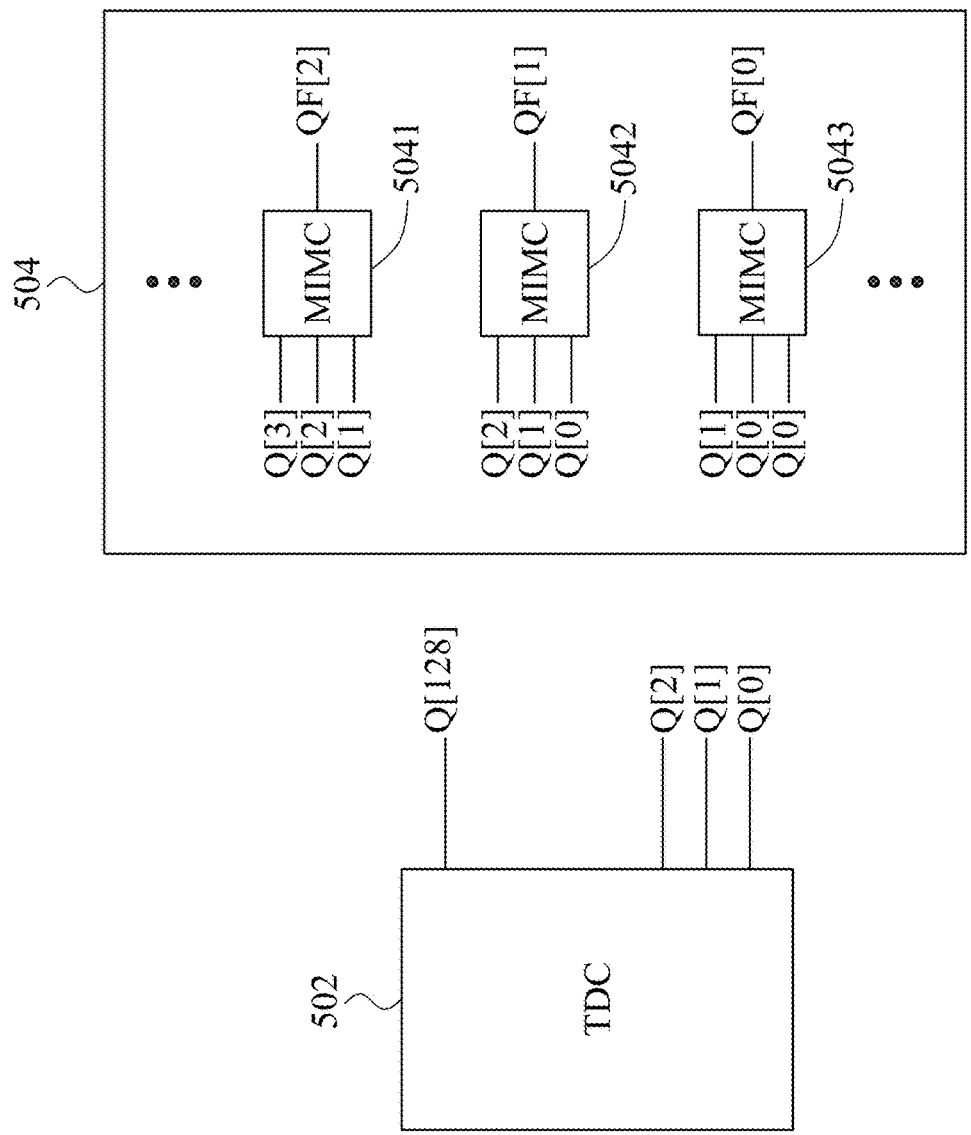
FIG. 5 illustrates another schematic view of a time-to-digital converter and an error cancelation circuit, in accordance with some embodiments of the present disclosure.

FIG. 5 illustrates a schematic view of a TDC 502 and an error cancelation circuit 504, in accordance with some embodiments of the present disclosure. The error cancelation circuit 504 may include a plurality of multi-input majority correction (MIMC) circuits, for example, 5041 to 5043. Each of the MIMC circuits 5041 to 5043 could be utilized to determine the majority bit value among adjacent or continuous bits.

The outputs Q[0]~Q[128] of the TDC 502 could be transmitted to the error cancelation circuit 504. More specifically, the MIMC 5041 includes 3 inputs Q[1]~Q[3] and an output QF[2], and the output QF[2] is determined by the bit that appears most often among the inputs Q[1]~Q[3]. The MIMC 5042 includes 3 inputs Q[0]~Q[2] and an output QF[1], and the output QF[1] is determined by the bit that appears most often among the inputs Q[0]~Q[2].

In some embodiments, the $N^{th}$ bit of the phase error signal Er from the error cancelation circuit 504 is determined based on odd number of bits of the converting signal CS of the TDC 502. The odd number of bits may include the $N^{th}$ bit of the converting signal CS and the even number of bits of the converting signal CS adjacent to the $N^{th}$ bit of the converting signal CS. Specifically, the $N^{th}$ bit of the phase error signal Er is determined as the bit that appears most often among the $(N-1)^{th}$ bit, $N^{th}$ bit, and $(N+1)^{th}$ bit of the converting signal CS by the MIMCs.

For example, in this case, when the bit values of the inputs Q[1]~Q[3] is 0, 0, 1, the MIMC 5041 could determine that bit value of the output QF[2] is 0 which is the bit that appears most often among the inputs Q[1]~Q[3]. In other embodiments, when the bit values of the inputs Q[1]~Q[3] is 1, 0, 1, the MIMC 5041 could determine the bit value of the output QF[2] as 1 because it is the majority among the bit values of the inputs Q[1]~Q[3].

In some embodiments, when the $(N-1)^{th}$ bit of the converting signal CS has a value of X, the $N^{th}$ bit of the converting signal CS has a value of Y, and the $(N+1)^{th}$ bit of the converting signal CS has a value of Z, the $N^{th}$ bit of the phase error signal Er, F, is determined by:

$$F = X \cdot Y + X \cdot Z + Y \cdot Z$$

For example, when the values of X, Y, Z are 1, 0, 1, the value of F will be 1. When the values of X, Y, Z are 1, 0, 0, the value of F will be 0. When the values of X, Y, Z are 0, 1, 0, the value of F will be 0. The value of F could be obtained by calculating the majority of the values of X, Y, Z.

Furthermore, the first bit of the phase error signal Er is equal to the first bit of the converting signal CS, and the last bit of the phase error signal Er is equal to the last bit of the converting signal CS. The majority correction may be skipped or omitted for the first bit and the last bit of the phase error signal Er.

In addition, the first bit of the phase error signal Er is equal to the first bit of the converting signal CS, the second bit of the phase error signal Er is equal to the second bit of the converting signal CS, the second-to-last bit of the phase error signal Er is equal to the second-to-last bit of the converting signal CS, and the last bit of the phase error signal Er is equal to the last bit of the converting signal CS. Therefore, the majority correction may be skipped or omitted for the first bit, the second bit, the second-to-last bit and the last bit of the phase error signal Er.

In some embodiments, when the $(N-2)^{th}$ bit of the converting signal CS has a value of A, the $(N-1)^{th}$ bit of the converting signal CS has a value of B, the $N^{th}$ bit of the converting signal CS has a value of C, the $(N+1)^{th}$ bit of the converting signal CS has a value of D, and the $(N+2)^{th}$ bit of the converting signal CS has a value of E, the $N^{th}$ bit of the phase error signal Er, F, could be determined by:

$$F = (A \cdot B \cdot C) + (B \cdot C \cdot D) + (C \cdot D \cdot E) + (A \cdot B \cdot D) + (A \cdot B \cdot E) + \\ (B \cdot C \cdot E) + (A \cdot C \cdot D) + (A \cdot D \cdot E) + (B \cdot D \cdot E) + (A \cdot C \cdot E)$$

For example, when the values of A, B, C, D and E are 1, 0, 1, 0, 1, the value of F will be 1. When the values of A, B, C, D and E are 1, 0, 0, 0, 1, the value of F will be 0. When the values of A, B, C, D and E are 0, 1, 1, 0, 0, the value of F will be 0. Therefore, the value of F could be obtained by calculating the majority of the values of A, B, C, D and E.

TABLE 3

| Stage N | Ideal Q[N] | Q[N] with bubble | QF[N] by OR gate correction | QF[N] by majority correction |
|---------|-----------|------------------|-----------------------------|------------------------------|
| 128 | | | | |
| ... | | | | |
| 13 | 1 | 1 | 1 | 1 |
| 12 | 1 | 1 | 1 | 1 |
| 11 | 0 | 0 | 1 | 0 |
| 10 | 0 | 0 | 0 | 0 |
| 9 | 0 | 0 | 0 | 0 |
| 8 | 0 | 0 | 0 | 0 |

TABLE 3-continued

| Stage N | Ideal Q[N] | Q[N] with bubble | QF[N] by OR gate correction | QF[N] by majority correction |
|---|---|---|---|---|
| 7 | 0 | 0 | 0 | 0 |
| 6 | 0 | 1 | 1 | 0 |
| 5 | 1 | 0 | 1 | 1 |
| 4 | 1 | 1 | 1 | 1 |
| 3 | 1 | 1 | 1 | 1 |
| 2 | 1 | 1 | 1 | 1 |
| 1 | 1 | 1 | 1 | 1 |

In the embodiment shown in Table 3, there is a bubble on Q[5]~Q[7], and two proposals are provided to address the issue. When the OR gate correction is executed, the bubble on Q[5]~Q[7] could be cured or eliminated. However, compared to the ideal Q[N] without bubbles, the number of the bit value 1 is increased by two.

When the majority correction is executed, the bubble on Q[5]~Q[7] could be cured or eliminated. Additionally, compared to the ideal Q[N] without bubbles, the number of the bit value 1 is not increased and remains the same. In some embodiments, the corrected QF[N] could be identical to the ideal Q[N].

Because the bubble is cured or eliminated, the jitter or fluttering of the signal could be reduced. Specifically, the jitter of the signal with OR gate correction is smaller than the jitter of the signal with bubbles. Moreover, the jitter of the signal with the proposed majority error correction is smaller than the jitter of the signal with OR gate correction.

Figure 6:
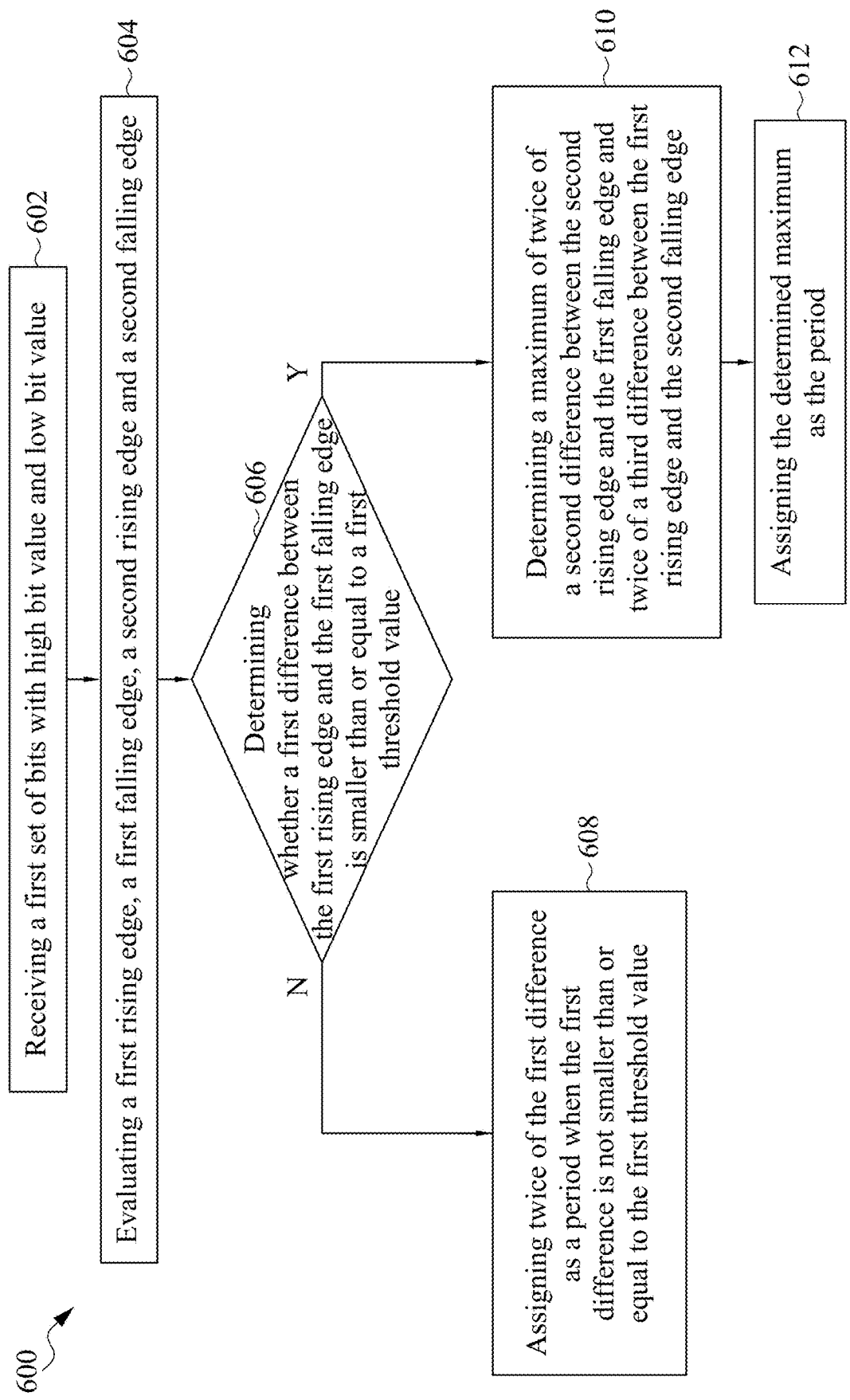
FIG. 6 illustrates a flow chart including operations of error correction for an electronic circuit, in accordance with some embodiments of the present disclosure.

FIG. 6 illustrates a flow chart 600 including operations of error correction for the electronic circuit 10, in accordance with some embodiments of the present disclosure. In operation 602, a first set of bits with high bit value and low bit value is received. The first set of bits could be included in the converting signal CS. In operation 604, a first rising edge, a first falling edge, a second rising edge and a second falling edge are evaluated or determined based on the first set of bits.

In some embodiments, the first rising edge may correspond to the most recent transition from a low bit value (such as 0) to a high bit value (such as 1). The second rising edge may correspond to the second most recent transition from a low bit value to a high bit value. The first falling edge may correspond to the most recent transition from a high bit value to a low bit value. The second falling edge may correspond to the second most recent transition from a high bit value to a low bit value.

In some embodiments, the first rising edge could be assigned as the rising time of the first set of bits. The second rising edge could be assigned as the rising time of the first set of bits. The first falling edge could be assigned as the falling time of the first set of bits. The second falling edge could be assigned as the falling time of the first set of bits.

TABLE 4

| Index | Ideal CKV | CKV with bubble |
|---|---|---|
| 1 | 1 | 1 |
| 2 | 1 | 1 |
| 3 | 1 | 1 |
| 4 | 1 | 1 |
| 5 | 1 | 1 |
| 6 | 1 | 0 |
| 7 | 0 | 1 |
| 8 | 0 | 0 |
| 9 | 0 | 0 |
| 10 | 0 | 0 |
| 11 | 0 | 0 |
| 12 | 1 | 1 |
| 13 | 1 | 1 |
| 14 | 1 | 1 |
| 15 | 1 | 1 |
| 16 | 1 | 1 |
| 17 | 0 | 0 |

In the embodiment of Table 4 and FIG. 2, regarding the clock signal CKV of the TDC 202, the first rising edge corresponds to the index 6, the first falling edge corresponds to the index 11, the second rising edge corresponds to the index 16, and the second falling edge does not exist in Table 4.

Furthermore, regarding the clock signal CKV with a bubble on the index 7, the first rising edge corresponds to the index 5, the first falling edge corresponds to the index 6, the second rising edge corresponds to the index 7, and the second falling edge corresponds to the index 11.

Now return to FIG. 6. In operation 606, whether a first difference between the first rising edge and the first falling edge is smaller than or equal to a first threshold value is determined. For example, the first threshold value could be 2. If the first difference is smaller than or equal to a first threshold value, the operation 610 will be executed. If the first difference is not smaller than or equal to a first threshold value, the operation 608 will be executed.

In operation 608, twice of the first difference is assigned as a period of the clock signal CKV. In operation 610, a maximum of twice of a second difference between the second rising edge and the first falling edge and twice of a third difference between the first rising edge and the second falling edge is determined. In operation 612, the determined maximum is assigned as the period of the clock signal CKV.

Figure 7A:
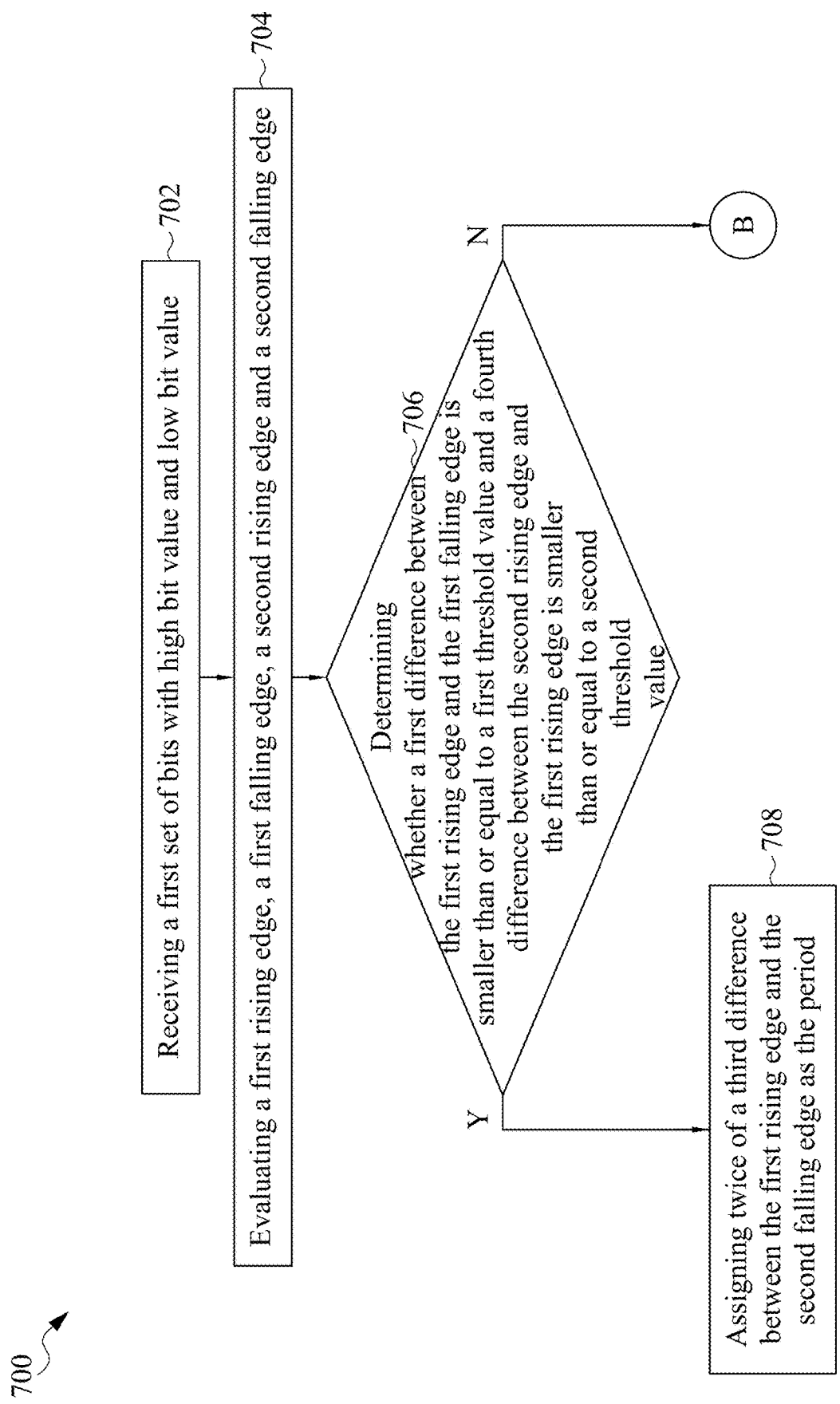
FIGS. 7A and 7B illustrate another flow chart including operations of error correction for an electronic circuit, in accordance with some embodiments of the present disclosure.
Figure 7B:
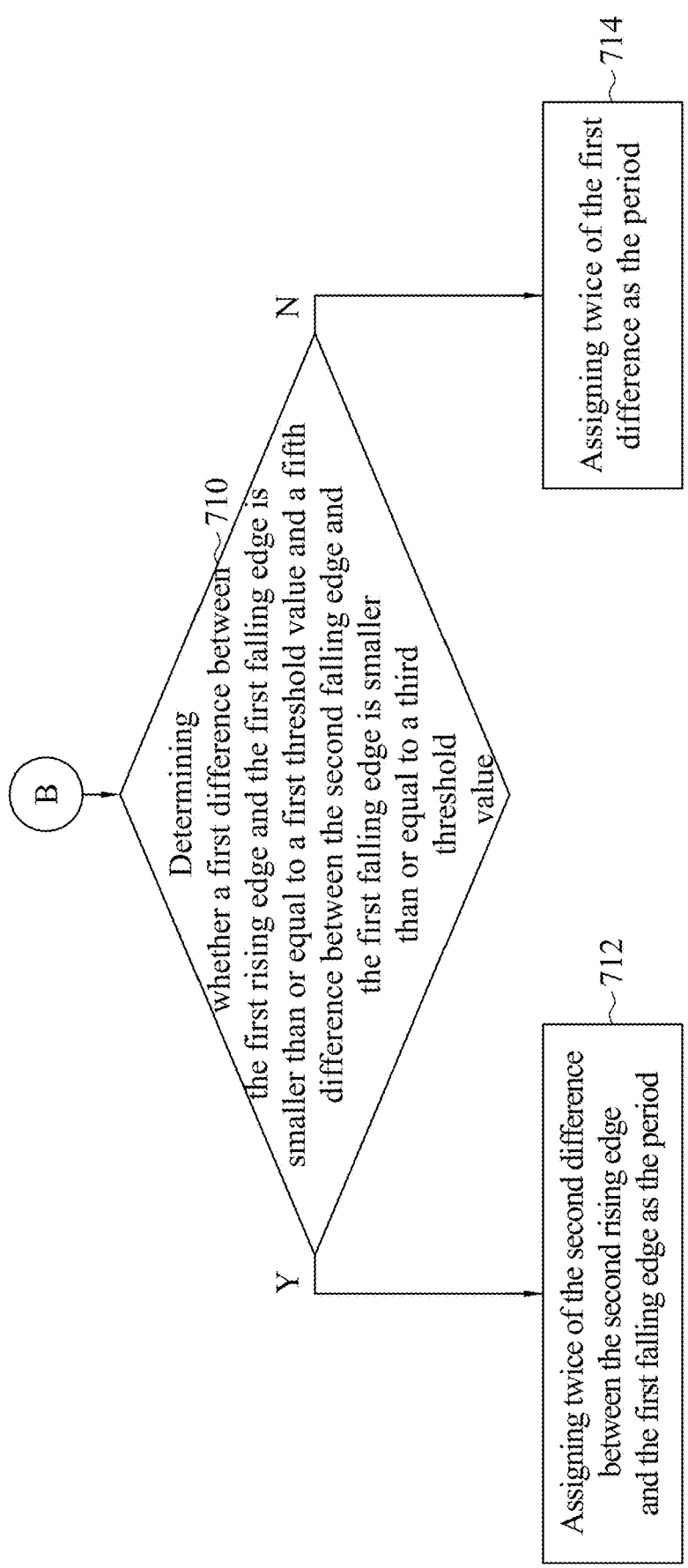

FIGS. 7A and 7B illustrate another flow chart 700 including operations of error correction for the electronic circuit 10, in accordance with some embodiments of the present disclosure. In operation 702, a first set of bits with high bit value and low bit value is received. The first set of bits could be included in the converting signal CS. In operation 704, a first rising edge, a first falling edge, a second rising edge and a second falling edge are evaluated or determined based on the first set of bits.

In operation 706, whether a first difference between the first rising edge and the first falling edge is smaller than or equal to a first threshold value is determined, and whether a fourth difference between the second rising edge and the first rising edge is smaller than or equal to a second threshold value is determined. In some embodiments, the first threshold value could be equal to the second threshold value. The first threshold value and the second threshold value could be 2. The first threshold value could be greater than the second threshold value. The first threshold value could be smaller than the second threshold value.

If the first difference is smaller than or equal to a first threshold value, and the fourth difference is smaller than or equal to a second threshold value, the operation 708 will be executed. If the first difference is not smaller than or equal to a first threshold value, or the fourth difference is not smaller than or equal to a second threshold value, the operation 710 will be executed.

In operation 708, twice of a third difference between the first rising edge and the second falling edge as the period. In operation 710, whether a first difference between the first rising edge and the first falling edge is smaller than or equal to a first threshold value is determined, and a fifth difference between the second falling edge and the first falling edge is smaller than or equal to a third threshold value is determined. The third threshold value could be equal to the second threshold value. The third threshold value and the second threshold value could be 2. The third threshold value could be greater than the second threshold value. The third threshold value could be smaller than the second threshold value.

If the first difference is smaller than or equal to a first threshold value, and the fifth difference is smaller than or equal to a third threshold value, the operation 712 will be executed. If the first difference is not smaller than or equal to a first threshold value, or the fifth difference is not smaller than or equal to a third threshold value, the operation 714 will be executed.

In operation 712, twice of the second difference between the second rising edge and the first falling edge is assigned or determined as the period of the clock signal CKV. In operation 714, twice of the first difference is assigned or determined as the period of the clock signal CKV.

In some embodiments, the fractional phase error value E could be calculated or determined by the following equation:

$$E = 1 - \frac{tr}{Tv} = 1 - \frac{tr}{|tr - tf| * 2}$$

In the equation, Tv could be the period of the clock signal CKV, tr could be the rising time of the first set of bits of the converting signal CS, and tf could be the falling time of the first set of bits of the converting signal CS.

In some embodiments, the fractional phase error value E could be determined from the converting signal CS and the phase error signal Er by utilizing the above equation. The fractional phase error value E determined by the converting signal CS could be greater than another fractional phase error value E determined by the phase error signal Er. Therefore, the bubble issue could be reduced or eliminated to improve the accuracy and stability of the electronic circuit 10.

Figure 8:
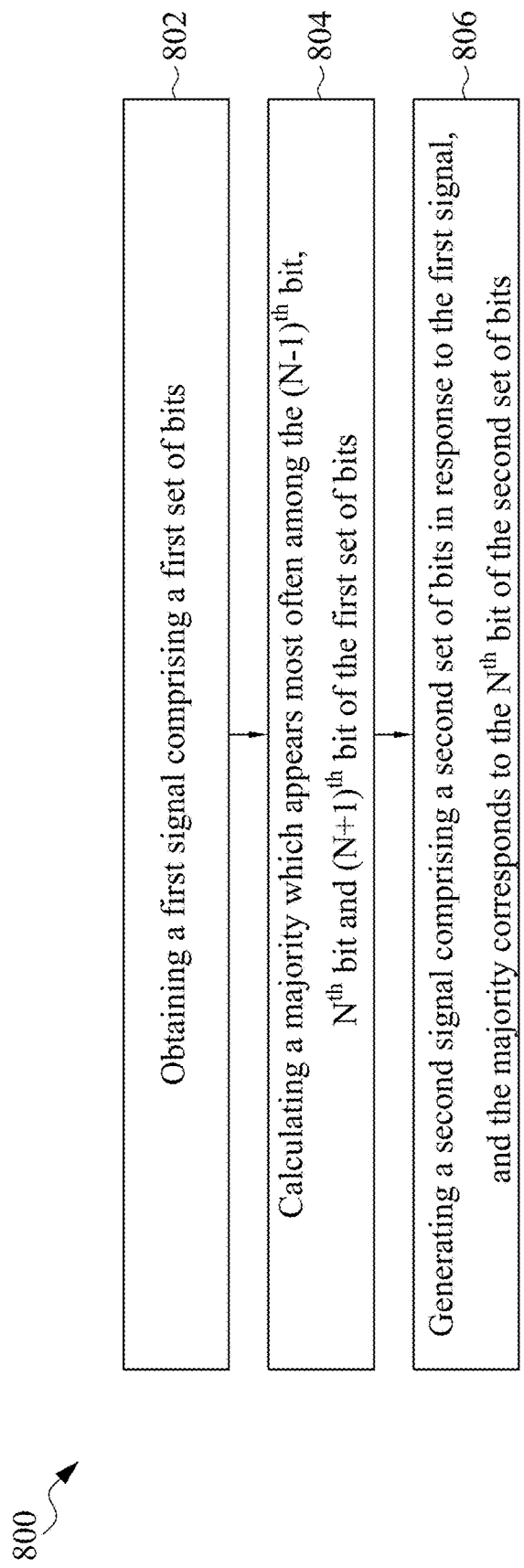
FIG. 8 illustrates another flow chart including operations of error correction for an electronic circuit, in accordance with some embodiments of the present disclosure.

FIG. 8 illustrates another flow chart 800 including operations of error correction for the electronic circuit 10, in accordance with some embodiments of the present disclosure. In operation 802, a first signal comprising a first set of bits is obtained. In operation 804, a majority which appears most often among the $(N-1)^{th}$ bit, $N^{th}$ bit and $(N+1)^{th}$ bit of the first set of bits is calculated. In operation 806, a second signal including a second set of bits could be generated in response to the first signal, and the majority corresponds to the $N^{th}$ bit of the second set of bits.

Figure 9:
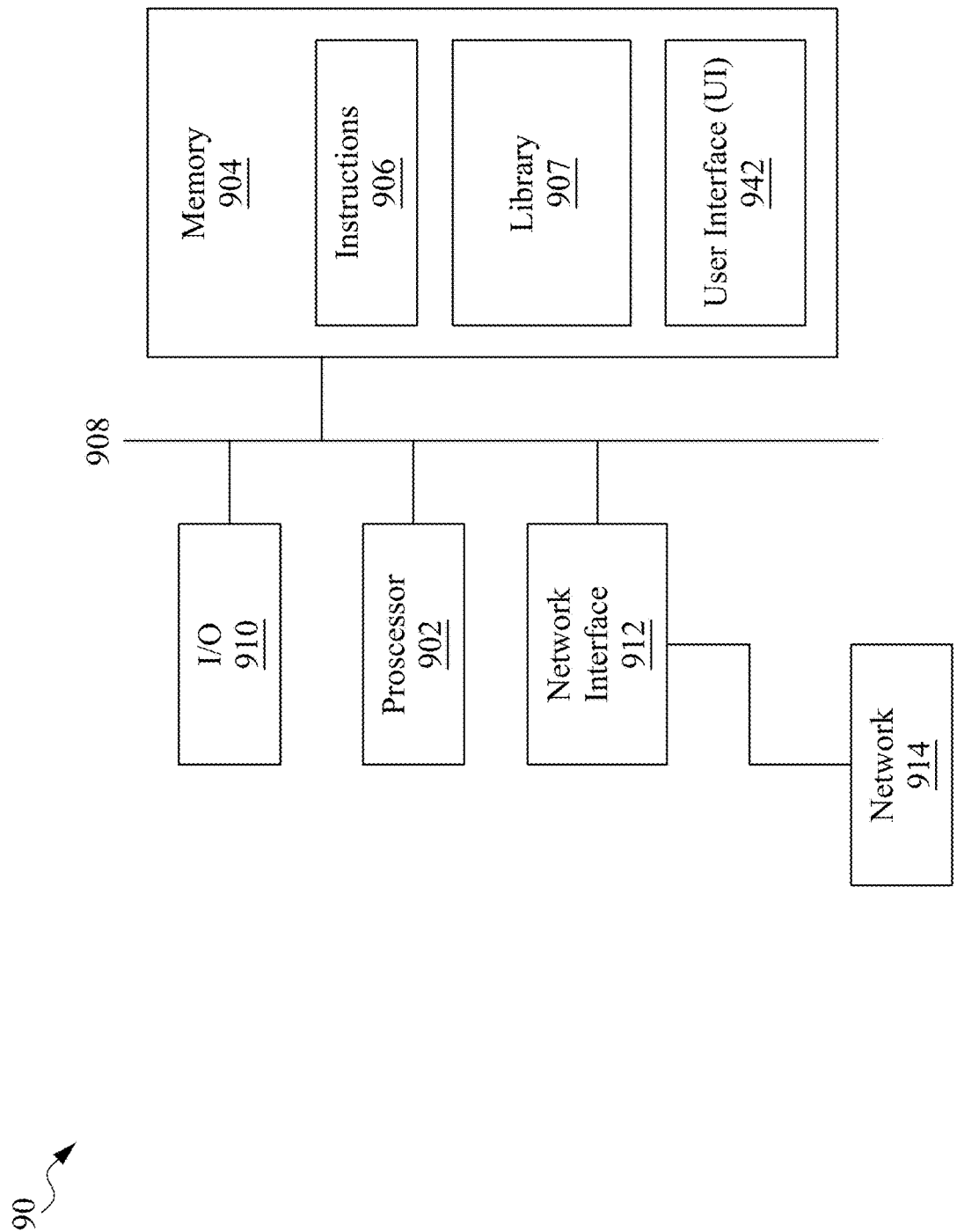
FIG. 9 is a block diagram of a system of designing an electronic circuit, in accordance with some embodiments.

FIG. 9 is a block diagram of a system of designing an electronic circuit, in accordance with some embodiments. In some embodiments, system 90 could be used to implement or execute the operations provided in FIG. 6 to FIG. 8. Methods described herein of correcting errors, in accordance with one or more embodiments, are implementable, for example, using the system 90, in accordance with some embodiments.

In some embodiments, the system 90 is a general purpose computing device including a hardware processor 902 and a memory 904. Memory 904 may be a computer-readable storage medium 904. Storage medium 904, amongst other things, is encoded with, i.e., stores, computer program code 906, i.e., a set of executable instructions. Execution of instructions 906 by hardware processor 902 represents (at least in part) an EDA tool which implements a portion or all of a method according to an embodiment, e.g., the methods described herein in accordance with one or more embodiments (hereinafter, the noted processes and/or methods).

Processor 902 may be electrically coupled to computer-readable storage medium 904 via bus 908. Processor 902 may be electrically coupled to an I/O interface 410 by bus 908. A network interface 912 may be electrically connected to processor 902 via bus 908. Network interface 912 may be connected to a network 914, so that processor 902 and computer-readable storage medium 904 are capable of connecting to external elements via network 914. Processor 902 may be configured to execute computer program code 906 encoded in computer-readable storage medium 904 in order to cause system 90 to be usable for performing a portion or all of the noted processes and/or methods. In one or more embodiments, processor 902 is a central processing unit (CPU), a multi-processor, a distributed processing system, an application specific integrated circuit (ASIC), and/or a suitable processing unit.

In one or more embodiments, computer-readable storage medium 904 is an electronic, magnetic, optical, electromagnetic, infrared, and/or semiconductor system (or apparatus or device). For example, computer-readable storage medium 904 may include a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 904 includes a compact disk-read only memory (CD-ROM), a compact disk-read/write (CD-R/W), and/or a digital video disc (DVD).

In one or more embodiments, storage medium 904 may store computer program code (instructions) 906 configured to cause system 90 (where such execution represents, at least in part, the EDA tool) to be usable for performing a portion or all of the noted processes and/or methods. In one or more embodiments, storage medium 904 may store information which facilitates performing a portion or all of the noted processes and/or methods. In one or more embodiments, storage medium 904 may store library 907 of standard cells including such standard cells as disclosed herein and one or more layout diagrams 908 such as are disclosed herein.

System 90 may include I/O interface 910. I/O interface 910 may be coupled to external circuitry. In one or more embodiments, I/O interface 910 may include a keyboard, keypad, mouse, trackball, trackpad, touchscreen, and/or cursor direction keys for communicating information and commands to processor 902.

System 90 may include network interface 912 coupled to processor 902. Network interface 912 may allow system 90 to communicate with network 914, to which one or more other computer systems are connected. Network interface 912 may include wireless network interfaces such as BLUETOOTH, WIFI, WIMAX, GPRS, or WCDMA. Network interface 912 may include wired network interfaces such as ETHERNET, USB, or IEEE-1364. In one or more embodiments, a portion or all of noted processes and/or methods, is implemented in two or more systems 90.

System 90 may be configured to receive information through I/O interface 910. The information received through I/O interface 910 may include one or more of instructions, data, design rules, libraries of standard cells, and/or other parameters for processing by processor 902. The information may be transferred to processor 902 via bus 908. System 90 may be configured to receive information related to a UI through I/O interface 910. The information may be stored in computer-readable medium 904 as user interface (UI) 942.

Some embodiments of the present disclosure provide an electronic circuit. The electronic circuit includes a time-to-digital converter (TDC) and an error cancelation circuit. The TDC is configured to generate a first signal. The error cancelation circuit is configured to evaluate a majority of bit values of at least a portion of the first signal to generate a second signal. The number of transitions within the second signal is less than the number of transitions within the first signal.

Some embodiments of the present disclosure provide a method of error correction for an electronic circuit. The method includes receiving a first set of bits; evaluating a first rising edge and a first falling edge, wherein the first rising edge corresponds to the most recent transition from a low bit value to a high bit value, and the first falling edge corresponds to the most recent transition from a high bit value to a low bit value; determining whether a first difference between the first rising edge and the first falling edge is smaller than or equal to a first threshold value; and assigning twice of the first difference as a period of the first set of bits when the first difference is not smaller than or equal to the first threshold value.

Some embodiments of the present disclosure provide a method of error correction for an electronic circuit. The method includes obtaining a first signal; and generating a second signal in response to the first signal, wherein the $N^{th}$ bit of the second signal corresponds to the majority among the $(N-1)^{th}$ bit, $N^{th}$ bit, and $(N+1)^{th}$ bit of the first signal.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An electronic circuit, comprising:
   a time-to-digital converter (TDC), configured to generate a first signal;
   an error cancelation circuit, configured to evaluate a majority of bit values of at least a portion of the first signal to generate a second signal, wherein a first fractional phase error value determined by the first signal is greater than a second fractional phase error value determined by the second signal;
   an adder, connected to the error cancelation circuit and configured to receive the second fractional phase error value;
   a digital filter, connected to the adder and configured to generate a filtered phase error value based on the second fractional phase error value; and
   a multiplier, connected to the digital filter and configured to multiply the filtered phase error value with a normalization factor.

2. The electronic circuit of claim 1, wherein the number of transitions within the second signal is less than the number of transitions within the first signal.

3. The electronic circuit of claim 1, wherein the $N^{th}$ bit of the second signal is determined based on odd number of bits of the first signal, and the odd number of bits comprise the $N^{th}$ bit of the first signal and the even number of bits of the first signal adjacent to the $N^{th}$ bit of the first signal.

4. The electronic circuit of claim 3, wherein the $N^{th}$ bit of the second signal is determined by the bit that appears most often among the $(N-1)^{th}$ bit, $N^{th}$ bit, and $(N+1)^{th}$ bit of the first signal.

5. The electronic circuit of claim 4, wherein when the $(N-1)^{th}$ bit of the first signal has a value of X, the $N^{th}$ bit of the first signal has a value of Y, and the $(N+1)^{th}$ bit of the first signal has a value of Z, the $N^{th}$ bit of the second signal, F, is determined by:

$$F = X \cdot Y + X \cdot Z + Y \cdot Z.$$

6. The electronic circuit of claim 2, wherein the $N^{th}$ bit of the second signal is determined by the bit that appears most often among the $(N-2)^{th}$ bit, $(N-1)^{th}$ bit, $N^{th}$ bit, $(N+1)^{th}$ bit, and $(N+2)^{th}$ bit of the first signal.

7. The electronic circuit of claim 6, wherein when the (N−2)th bit of the first signal has a value of A, the (N−1)th bit of the first signal has a value of B, the Nth bit of the first signal has a value of C, the (N+1)th bit of the first signal has a value of D, and the (N+2)th bit of the first signal has a value of E, the Nth bit of the second signal, F, is determined by:

$$F = (A \cdot B \cdot C) + (B \cdot C \cdot D) + (C \cdot D \cdot E) + (A \cdot B \cdot D) + (A \cdot B \cdot E) + \\ (B \cdot C \cdot E) + (A \cdot C \cdot D) + (A \cdot D \cdot E) + (B \cdot D \cdot E) + (A \cdot C \cdot E).$$

8. The electronic circuit of claim 1, wherein the first bit of the second signal is equal to the first bit of the first signal, and the last bit of the second signal is equal to the last bit of the first signal.

9. The electronic circuit of claim 1, wherein the TDC further comprises
   a set of inverters connected in series; and
   a set of flip-flops, each flip-flop connected with the corresponding inverter,
   wherein an input of the first one of the set of inverters receives a first clock signal, and each of the set of flip-flops receives a second clock signal.

10. A method of error correction for an electronic circuit, comprising:
    receiving a first set of bits;
    evaluating a first rising edge and a first falling edge, wherein the first rising edge corresponds to the most recent transition from a low bit value to a high bit value, and the first falling edge corresponds to the most recent transition from a high bit value to a low bit value; and
    if a first difference between the first rising edge and the first falling edge is smaller than or equal to a first threshold value, evaluating a second rising edge and a second falling edge, wherein the second rising edge corresponds to the second most recent transition from low bit value to high bit value, and the second falling edge corresponds to the second most recent transition from high bit value to low bit value.

11. The method of claim 10, further comprising:
    if a first difference between the first rising edge and the first falling edge is greater than a first threshold value, assigning twice of the first difference as a period of the first set of bits when the first difference is not smaller than or equal to the first threshold value.

12. The method of claim 10, further comprising:
determining a maximum of twice of a second difference between the second rising edge and the first falling edge and twice of a third difference between the first rising edge and the second falling edge; and
assigning the maximum as the period when the first difference is smaller than or equal to the first threshold value.

13. The method of claim 10, wherein the first rising edge is the rising time of the first set of bits.

14. The method of claim 12, further comprising:
determining whether a fourth difference between the second rising edge and the first rising edge is smaller than or equal to a second threshold value; and
assigning twice of the third difference as the period when a first condition is met, wherein the first condition comprises the first difference being smaller than or equal to the first threshold value and the fourth difference is smaller than or equal to the second threshold value.

15. The method of claim 14, further comprising:
determining whether a fifth difference between the second falling edge and the first falling edge is smaller than or equal to a third threshold value when the first condition is not met; and
assigning twice of the second difference as the period when a second condition is met, wherein the second condition comprises the first difference being smaller than or equal to the first threshold value and the fifth difference is smaller than or equal to the third threshold value.

16. The method of claim 15, wherein the second threshold value is equal to the first threshold value, and the third threshold value is equal to the first threshold value.

17. The method of claim 15, further comprising:
assigning twice of the first difference as the period when the second condition is not met.

18. A method of error correction for an electronic circuit, comprising:
generating a first signal by a time-to-digital converter (TDC);
evaluating a majority of bit values of at least a portion of the first signal to generate a second signal by an error cancelation circuit, wherein a first fractional phase error value determined by the first signal is greater than a second fractional phase error value determined by the second signal;
receiving the second fractional phase error value by an adder;
generating a filtered phase error value based on the second fractional phase error value by a digital filter connected to the adder; and
multiplying the filtered phase error value with a normalization factor.

19. The method of claim 18, wherein a first fractional phase error value determined by the first signal is greater than a second fractional phase error value determined by the second signal.

20. The method of claim 19, further comprising:
determining the Nth bit of the second signal based on odd number of bits of the first signal, wherein the odd number of bits comprise the Nth bit of the first signal and the even number of bits of the first signal adjacent to the Nth bit of the first signal.

* * * * *